United States Patent [19]

Fye

[11] Patent Number: 4,839,308

[45] Date of Patent: Jun. 13, 1989

[54] METHOD OF MAKING AN EXTERNAL-COUPLED-CAVITY DIODE LASER

[75] Inventor: Donald M. Fye, Wayland, Mass.

[73] Assignee: GTE Laboratories Incorporated, Waltham, Mass.

[21] Appl. No.: 114,922

[22] Filed: Oct. 30, 1987

Related U.S. Application Data

[62] Division of Ser. No. 887,467, Jul. 21, 1986, Pat. No. 4,726,030.

[51] Int. Cl.$^4$ .................. H01L 21/20; H01L 21/203; H01L 21/205
[52] U.S. Cl. ..................................... 431/129; 437/228; 437/249
[58] Field of Search .................. 437/129, 126, 80; 372/550, 92, 49

[56] References Cited

U.S. PATENT DOCUMENTS

| | | | |
|---|---|---|---|
| 4,054,363 | 10/1977 | Suematsu | 437/129 |
| 4,503,541 | 3/1985 | Weller et al. | 372/50 |
| 4,528,670 | 7/1985 | Burrus, Jr. et al. | 372/92 |
| 4,564,946 | 1/1986 | Olsson et al. | 372/50 |
| 4,608,697 | 8/1986 | Coldren | 372/50 |
| 4,749,255 | 1/1988 | Chakrabarti et al. | 350/164 |

OTHER PUBLICATIONS

Ohsawa et al., "Mirror Coating of AlGaAs TJS Lasers by an Si/SiO$_2$ Reflector", vol. 19, No. 10, Dec. 1980, pp. 2025-2026.

*Primary Examiner*—Brian E. Hearn
*Assistant Examiner*—Tom Thomas
*Attorney, Agent, or Firm*—James J. Cannon, Jr.

[57] ABSTRACT

A monolithic external-coupled-diode laser structure uses high reflectivity facet coatings to reduce the operating current and to improve suppression of unwanted longitudinal modes.

2 Claims, 1 Drawing Sheet

METHOD OF MAKING AN EXTERNAL-COUPLED-CAVITY DIODE LASER

CROSS-REFERENCE TO RELATED APPLICATION

This invention is a division of U.S. patent application Ser. No. 06/887,467, issued Feb. 16, 1988 as U.S. Pat. No. 4,726,030.

BACKGROUND OF THE INVENTION

1. Field of the Invention

This invention relates to methods of making external-coupled-cavity diode lasers. Accordingly, it is a general object of this invention to provide new and improved methods of such character.

2. General Background

The following publications supply a background for the invention. Their specific pertinence will become more apparent from a reading of this specification.

1. M. Kitamura, M. Seki, M. Yamaguchi, I. Mito, S. Murata, and K. Kobayashi, "Single-Longitudinal-Mode 1.3 $\mu$m DFB-DC-PBH Laser Diodes", presented at the Topical Meeting on Optical Fiber Communication (New Orleans, La.), paper No. MF2, Jan. 23–25, 1984, hereinafter termed "Kitamura et al.".

2. W. T. Tsang, N. A. Olsson, and R. A. Logon, "High Speed Single-Frequency Modulation with Large Tuning Rate and Frequency Excursion in Cleaved-Coupled-Cavity Semiconductor Lasers", Appl. Phys. Lett., vol. 42, p.650 (1983), hereinafter termed "Tsang et al".

3. L. A. Coldren, C. A. Burrus, K. J. Ebeling, T. L. Koch, R. G. Swartz, and J. E. Bowers, "Verification of Coupling Gap Dependence in Coupled Cavity Lasers", presented at the Topical Meeting on Optical Fiber Communication (New Orleans, La.), paper No. MF5, Jan. 23–25, 1984, hereinafter termed "Coldren et al. #1".

4. L. A. Coldren, R. G. Swartz, K. J. Ebeling, and C. A. Burrus, "Stable Single-Wavelength Operation of Two-Section Coupled-Cavity Lasers Under Modulation Using Feedback Control", presented at the Topical Meeting on Optical Fiber Communication (New Orleans, La.), paper No. MF6, Jan. 23–25, 1984, hereinafter termed "Coldren et al. #2".

5. C. Lin, C. A. Burrus, and L. A. Coldren, "Characteristics of Single-Longitudinal-Mode Selection in Short-Coupled-Cavity Injection Lasers", *IEEE J. Lightwave Tech.*, vol. LT-2, p.544 (1984), hereinafter termed "Lin et al.".

6. K.-Y. Liou, S. W. Grandlund, C. B. Swan, C. A. Burrus, R. A. Linke, I. P. Kaminow, and P. Besomi, "Single-Longitudinal-Mode Operation of GRIN Rod External-Coupled-Cavity Semiconductor Lasers", presented at the Topical Meeting on Optical Fiber Communication (New Orleans, La.), paper No. TUL2, Jan. 23–25, 1984, hereinafter termed "Liou et al.".

7. D. M. Fye, "An Optimization Procedure for the Selection of Diode Laser Facet Coatings", IEEE J. Quantum Electron., vol. QE-17, p.1950 (1981), hereinafter termed "applicant's earlier paper".

In order to optimize the use of a fiber optic communication system, the optical source should emit at the wavelength for which attenuation in the optical fiber is minimized. In addition, the spectral width of the modulated source should be sufficiently narrow to avoid significant pulse distortion due to fiber dispersion. Fiber dispersion, as is known, is a characteristic due to different spectral components of a pulse that travel along a fiber at different speeds. Typical optical fibers exhibit minimum attenuation at a wavelength of 1.55 $\mu$m, but fiber dispersion at that wavelength is sufficient to limit the performance of high speed transmission systems unless diode lasers with single longitudinal mode emission are used as optical sources. The development of mode-stabilized diode lasers is therefore desired for high speed, long distance optical communication applications.

Several different types of mode-stabilized diode lasers exist. They include distributed feedback (DFB) lasers, cleaved-coupled-cavity ($C^3$) lasers, and external-coupled-cavity lasers. All of these devices achieve single-mode operation through the introduction of wavelength-dependent cavity losses which allow only a single longitudinal mode to reach lasing threshold. While DFB lasers, according to Kitamura et al., supra, provide excellent suppression of spurious longitudinal modes, their fabrication requires fine-line lithography which reduces the yield and increases the production cost. $C^3$ lasers, according to Tsang et al., supra, are three-terminal devices, the operation of which are greatly complicated by the need to control two modulation currents in order to obtain high-speed, single-mode emission over realistic changes of device characteristics with aging and temperature fluctuations, as suggested by Coldren et al. #1, supra. In addition, the operating characteristics of $C^3$ lasers are critically dependent on the length of the gap between two laser sections, as taught by Coldren et al. #2, supra. The gap length is extremely difficult to control during device fabrication, resulting in unpredictable device performance, reduced yields and increased cost.

External-coupled-cavity lasers use a passive external cavity in combination with a simple Fabry-Perot laser to obtain the wavelength-selective cavity loss necessary for single-mode operation. External cavities consisting of planar reflectors, as suggested by Lin et al., supra, or mirror-coated graded index rods, as suggested by Liou et al., supra, have been reported to yield single-mode emission over reasonable temperature ranges.

Significantly, a disadvantage of previously reported external-coupled-cavity laser structures is that the critical alignment of the external reflectors is difficult to achieve in an efficient production process. In addition, previous structures failed to realize the significant improvement in spurious mode rejection and reduced operating current that can be obtained by using high reflectivity facet coatings on the diode laser as taught herein.

SUMMARY OF THE INVENTION

Another object of this invention is to provide for a new and improved external cavity laser structure that utilizes optical coatings to increase the facet reflectivities and improve the suppression of spurious longitudinal modes in the laser emission.

Still another object of this invention is to provide for new and improved external cavity laser structures in which the use of optimized facet coatings results in reduced operating current and improved device reliability.

Yet another object of this invention is to provide for a new nd improved external cavity laser that can be fabricated as a monolithic structure on a single semiconductor substrate.

Still yet another object of this invention is to provide for a new and improved semiconductor laser in which good performance can be obtained when device fabrication is simplified through the use of applying identical coatings to both the laser facets and external reflector.

In accordance with various aspects of the invention, an external-coupled-cavity diode laser with improved operation is provided by a method that provides simplified fabrication, including the steps of providing a monolithic structure having a first surface, and forming a Fabry-Perot diode laser thereonto so that the Fabry-Perot laser has a pair of opposed facets. Then, a mirror is formed onto the first surface of the monolithic structure for reflecting light from one of the facets back to that one facet, and both the facets and the mirror are coated with identical optical coatings. The coated facets improve single-mode emission. In accordance with certain features of the invention, each of the facets and the mirror consist of a planar surface. The planar surfaces of the facets and the mirror should be parallel to each other. The surfaces of the facets and the mirror are coated with identical optical coatings to enhance their reflectivity. The coatings can be selected from the group consisting of aluminum oxide and silicon. The surfaces of the facets can be formed, separated from each other, at a distance of about 50 microns, wherein the one facet can be separated from the surface of the mirror by a distance of about 70 microns. The term "about 50 microns" can include a range of from 30 microns to 100 microns. The term "about 70 microns" can include a range of from 40 microns to 160 microns.

In accordance with another aspect of the invention, a method of making a monolithic external-coupled-cavity diode laser includes the steps of providing an indium phosphide (InP) substrate having a pair of opposed surfaces. A diode laser layer structure is epitaxially deposited onto one of the surfaces of the substrate. Then, the rear laser facet and external reflector surfaces are formed by etching through the laser structure into the substrate. The front laser facet is then formed by cleaving or etching through the laser layers parallel to the rear facet, and a common material is deposited onto the facets and the external reflector. According to certain features of the invention, the steps of the method can include forming contacts on the top of the laser and on the other surface of the substrate.

BRIEF DESCRIPTION OF THE DRAWINGS

Other objects, advantages and features of this invention, together with its mode of operation, will become more apparent from the following description, when read in conjunction with accompanying drawings, in which.

DESCRIPTION OF PREFERRED EMBODIMENT(S)

Figure 1:
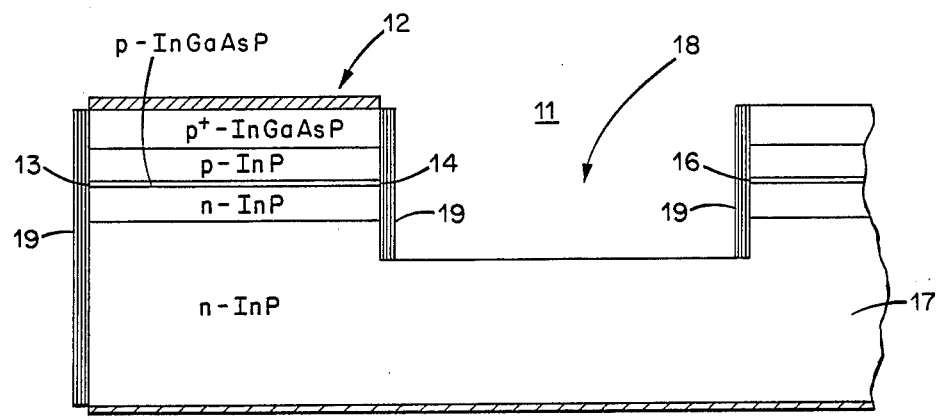
FIG. 1 is a cross-sectional view, partly broken away, of an external-coupled-cavity diode laser in accordance with this invention, with limited cross-hatching therein to facilitate an understanding of the construction thereof.

A schematic diagram of an external cavity laser structure 11 in accordance with this invention is depicted in FIG. 1. It includes a Fabry-Perot diode laser 12 with a length of about 50 microns having facets 13, 14 with reflectivities of about 70%. The Fabry-Perot diode laser 12 is coupled to an external mirror 16 having a reflectivity of 70-100% positioned about 70 microns behind the rear facet 14.

Figure 2A:
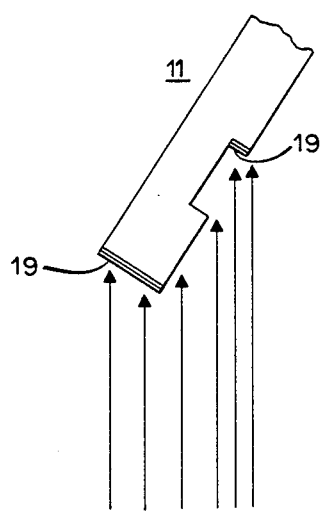
FIGS. 2a and 2b are views illustrating a method of making an external-coupled-cavity diode laser in accordance with an embodiment of this invention.
Figure 2B:
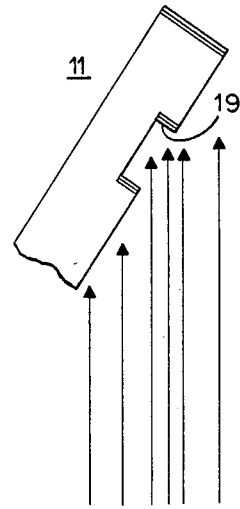

A preferred implementation of the device 11 is to fabricate the laser 12 and the external reflector 16 in a single monolithic structure 17 by using etched facet technology to define the laser facet 14 and the gap 18 between the laser 12 and the external reflector 16. Various of the available etched facet technologies can be used. The front facet 13 can be formed either by etched facet technology or by cleaving. After the laser 12 and the reflector 16 have been defined, both the facets 13,14 and the reflector surface 16 are coated to enhance their reflectivities. An efficient means of accomplishing this is shown in FIGS. 2a and 2b, where the same metallic or multilayer dielectric coatings 19—19 are applied to the facets and reflector surfaces by electron beam evaporation. As electron beam evaporation is highly directional, the coupled-cavity laser structure should be tilted and/or rotated during the deposition process to assure that coatings 19—19 with a reflectivity of about 70% are deposited on the reflector surface 16 and both laser facets 13,14. The foregoing fabrication techniques can be applied to efficient batch processing of many identical coupled-cavity lasers on a single wafer 17 without the need to cleave individual lasers and manually align them with separate external reflectors.

An alternate method for realizing an improved coupled-cavity laser structure would be to fabricate the laser and the external mirror separately and to mount them both on a common carrier. Disadvantageously, such a method is not desirable due to imprecision caused by alignment problems. This alternate method results in a structure similar to that of Lin et al., supra, with an important difference that the elevated laser facet reflectivities result in improved single-mode operation. The difficulty of accurately aligning the laser and external reflector makes production implementation of this structure more difficult than that of the monolithic device shown in FIG. 1.

At 4 mW continuous output, the coupled-cavity laser structure shown in FIG. 1 may have a center-to-side longitudinal mode ratio of >600:1. This side mode suppression is 100% larger than that expected for a 50 micron laser with the same facet coatings but no external reflector. It is about 50% larger than that of a coupled-cavity laser previously reported by Lin et al., supra, with no facet coatings and a gold coated high reflectivity external mirror.

For best single-mode emission, the length of the laser section in a coupled-cavity laser structure should be on the order of 50 microns, instead of the 200 micron length of conventional Fabry-Perot diode lasers. As the optical gain of a diode laser active layer decreases monotonically at wavelengths on either side of the gain peak (which makes the cavity yield more mode discrimination), the wide mode spacing of short-cavity lasers enhances the suppression of unwanted longitudinal modes and makes the mode selection less sensitive to temperature-induced shifts in the gain peak.

Increasing the reflectivity of the laser facets 13,14 yields a reduction in threshold current and improved single mode operation. As increased facet reflectivity also results in lower differential quantum efficiency, an optimum facet reflectivity is selected to minimize the laser operating current for a desired output power level, as suggested by applicant's earlier paper, supra. Assuming typical InGaAsP/InP laser characteristics, coating both facets 13 14 of a 50 micron length laser to a reflectivity of 70% should minimize the operating current required for 4 mW output. This represents a significant improvement over the characteristics of a 50 micron laser having uncoated facets.

The presence of the external cavity 18 between the rear facet 14 and the external reflector 16 results in a wavelength-dependent laser cavity loss which is used to increase suppression of spurious longitudinal modes. Single-mode operation of the diode laser 12 is enhanced by setting the length of the external cavity 18 to minimize the equivalent rear facet reflectivity at the wavelengths of the unwanted longitudinal modes immediately adjoining the central lasing mode. The optimum length of the external cavity 18 is calculated by considering the reflectivity of the laser facet 14 and the external reflector 16, as well as the optical loss in the cavity 18. For a 50 micron laser section, an external cavity length of about 70 microns has been found to yield the best single-mode operation.

In order to facilitate simple batch processing of monolithic coupled-cavity lasers, the coating 19 on the external mirror 16 is made identical to that of the laser facets 13,14. Single-mode operation can be improved by maximizing the external mirror 16 reflectivity and/or by improving the optical coupling between the laser 12 and external reflector 16. It has been calculated that, by increasing the external mirror reflectivity from 70% to 100%, only about 10% improvement in spurious mode suppression would result—generally not considered enough to justify an increased fabrication complexity.

Thus, it is noted that the improved coupled-cavity laser structure described hereinabove incorporates the following novel features:

1. Use of elevated facet reflectivities to improve single-mode emission and reduce operating current densities of coupled-cavity laser structures.

2. Use of identical optical coatings on laser facets and external mirror to provide simplified fabrication of monolithic coupled-cavity laser structures.

In summary, it has been shown that short cavity lasers having external reflectors exhibit excellent single-mode stability with little or no intersymbol interference under high speed modulation. The primary objection to the use of uncoated short cavity lasers has been that they operate at high current densities, which can significantly shorten device lifetime. However, in order to overcome this objection, the operating characteristics of facet-coated short cavity lasers in combination with external reflectors have been studied. It was found that a 50 micron laser in combination with a flat external mirror 70 microns behind the rear facet exhibits optimized operating characteristics when its facet reflectivities are on the order of 0.7. Its operating current density at 3 mW output can be 30% less than an uncoated device. In addition to lowering the operating current density the use of high reflectivity facet coatings also makes the laser significantly less sensitive to optical feedback.

What is claimed is:

1. A method of making a monolithic external-coupled-cavity diode laser comprising the steps of:
   providing an n-doped InP substrate having a pair of opposed surfaces;
   epitaxially depositing a layer of n-doped InP on one of said surfaces of said substrate;
   epitaxially depositing an active layer of InGaAsP on said epitaxial layer of n-doped InP,
   epitaxially depositing a layer of p-doped InP on said active layer;
   epitaxially depositing a layer of p+-doped InGaAsP on said p-doped layer;
   forming a cavity into at least said p+-doped InGaAsP layer, said p-doped InP layer, said active layer of InGaAsP, and said n-doped InP layer so as to provide an opposing rear facet of said diode laser at said active layer and to provide an opposing external mirror, a portion of said layers opposed to said rear facet being a front facet;
   depositing coatings of a common material on said facets and said mirror;
   forming a p-contact on said p+-layer of InGaAsP; and
   forming an n-contact on a second surface of said substrate.

2. The method as recited in claim 1 wherein:
   the step of depositing coatings includes the step of tilting the laser structure during the deposition process whereby the highly directional application of said coating material will simultaneously coat said front facet and said mirror and then coat said rear facet upon tilting said laser structure in another direction.

* * * * *